United States Patent [19]

Ohashi

[11] Patent Number: 5,200,884
[45] Date of Patent: Apr. 6, 1993

[54] ELECTRICAL CONTROL DEVICE
[75] Inventor: Shigeo Ohashi, Tokyo, Japan
[73] Assignee: Nihon Kaiheiki Kogyo Kabushiki Kaisha, Tokyo, Japan
[21] Appl. No.: 440,366
[22] Filed: Nov. 22, 1989
[30] Foreign Application Priority Data Feb. 15, 1989 [JP] Japan .................. 1-35811

[51] Int. Cl.⁵ .............................. H05K 1/18
[52] U.S. Cl. .................. 361/401; 200/295; 200/296; 248/27.3; 361/417; 361/420
[58] Field of Search .................. 200/294–296; 248/27.1, 27.3; 361/350, 351, 353, 400, 401, 417, 419, 420; 439/82

[56] References Cited

U.S. PATENT DOCUMENTS

| 2,922,978 | 1/1960 | Engel ....................... 439/82 |
| 4,109,296 | 8/1978 | Rostek et al. .............. 361/401 |
| 4,707,765 | 11/1987 | Ohashi ..................... 361/401 |
| 4,726,777 | 2/1988 | Billman et al. .............. 439/70 |

FOREIGN PATENT DOCUMENTS 59189566 12/1986 Japan .
1240789 7/1971 United Kingdom ............ 361/401
1461052 1/1977 United Kingdom ............ 361/401

OTHER PUBLICATIONS

No author, IBM Technical Disclosure Bulletin, vol. 28 No. 5, Oct. 1985, "Surface-Mounted Device on Circuitized Thermoformable Sheets", pp. 2068–2069.

Primary Examiner—Gregory D. Thompson
Attorney, Agent, or Firm—Birch, Stewart, Kolasch & Birch

[57] ABSTRACT

A control instrument has a body which is provided at the bottom surface thereof with a plurality of terminals. The terminals are folded upwardly along the side surfaces thereof and the body is inserted in the through-hole preformed in a printed wiring board to resiliently engage the body with the through-hole due to resiliency of the terminals. The leading end of the terminal is folded outwardly. The body is longitudinally formed at the side surfaces thereof with recesses for guiding the terminals therein. The body is longitudinally formed at the side surfaces thereof with recesses for guiding the terminals therein. Jaws projecting from the sides of the body are provided at the sides where the terminal are not provided.

7 Claims, 3 Drawing Sheets

ELECTRICAL CONTROL DEVICE

BACKGROUND OF THE INVENTION

The present invention relates to general to a control instrument such as a switch, a connector and the like, in particular to a control instrument for a printed wiring board and adapted to be mounted on a printed wiring board.

A construction shown in FIG. 10 is known as prior art in which a control instrument is mounted on a printed wiring board. With the construction shown in FIG. 10, the body of a switch is attached to a printed wiring board, not shown, at the upper surface thereof with its terminals projecting downwardly through the printed wiring board from the lower surface thereof. A connector is disposed under the printed wiring board so that the terminals of the switch can be inserted into the holes of the connector for connection.

As a conventional method of mounting control instruments on a printed wiring board, there are known the invention disclosed in the Japanese Patent Application No. 155,774/1984 (U.S. Pat. No. 4,707,765), hereinafter referred to as prior art A; the invention disclosed in Japanese Patent Application No. 207,515/1984 (U.S. Pat. No. 4,707,765) hereinafter referrred to as prior art B, and the Utility Model Registration Application No. 189,556/1984, hereinafter referred to as prior art C, all of which were made by the same inventor as that of the present invention.

Prior art A and B disclose a method wherein a printed wiring board is provided at its end portions with recesses in which control instruments are mounted, and also disclose a control instrument mounted in a recess provided on the end portion of the printed wiring board, and prior art C discloses a miniaturized switch mounted on a printed wiring board without the provisions of recesses.

However, with the above-mentioned construction of FIG. 10, the whole height of the switch (A'+B'+the thickness of the printed wiring board) becomes very great, and thus the switch has a disadvatage in that is retrogresses against miniaturization of the printed wiring board required for light weight, thickness, and compactness.

Although the objects of the inventions disclosed in the above-mentioned prior art A, B, and C are to miniaturize the printed wiring board on which the control instruments are mounted, and to enhance the utilization of such a printed wiring board, all three inventions are directed to the technique of mounting the control instruments on the printed wiring board at the end portions thereof, and not at any portions thereof.

SUMMARY OF THE INVENTION

The present invention is made in view of the disadvatages included in the prior art, and thus it is an object of the present invention to provide a novel control instrument for a printed wiring board which develops and improves the above-mentioned prior art to be capable of mounting the control instruments on the printed wiring board at any portion thereof, and miniaturizing the printed wiring board on which the control instruments are mounted.

To accomplish the above-mentioned object, a control instrument for a printed wiring board according to the present invention is of such a construction that, the body of the control instrument is provided at the bottom surface thereof with a plurality of terminals, said terminals being folded upwardly along the side surfaces of said body, and said body being inserted into the through-hole preformed in the printed wiring board to be resiliently fitted into the same.

DESCRIPTION OF THE DRAWINGS

For a better understanding of the present invention, reference may be had to the drawings in which.

DESCRIPTION OF THE PREFERRED EMBODIMENTS

Figure 1:
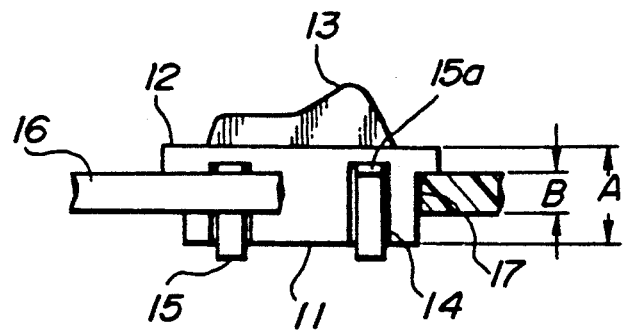
FIG. 1 is a partially cross-sectional front view showing a first embodiment of a control instrument for a printed wiring board according to the present invention.
Figure 2:
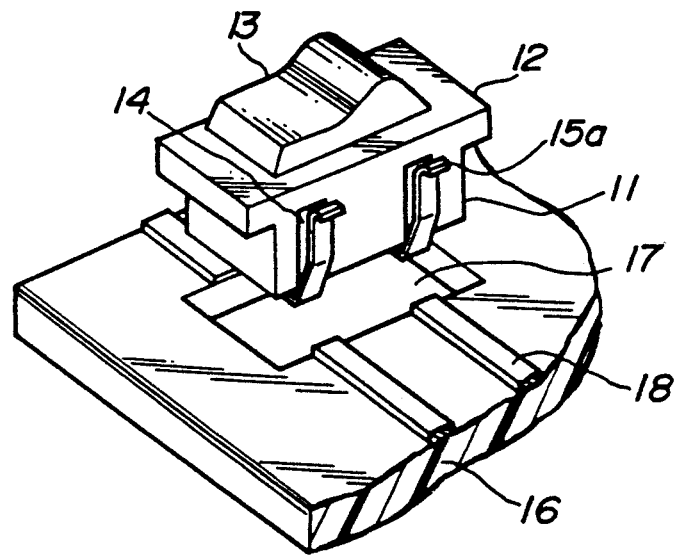
FIG. 2 is a perspective view showing the first embodiment according to the present invention together with the printed wiring board for mounting the same thereon.
Figure 3:
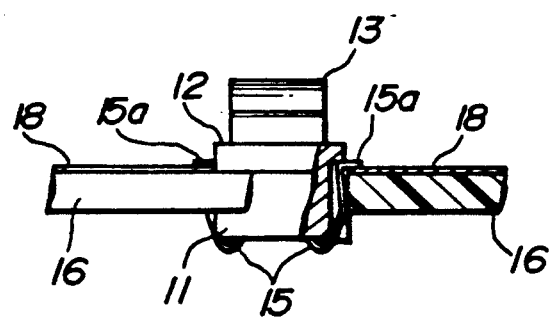
FIG. 3 is a partial cross-sectional side view showing the first embodiment according to the present invention.
Figure 4:
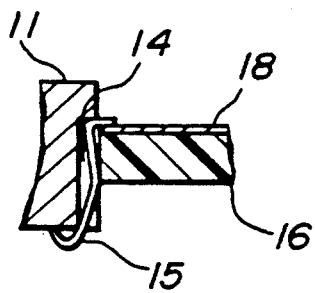
FIG. 4 is an enlarged, cross-sectional front view showing a main portion of the first embodiment according to the present invention.

Referring now to FIGS. 1 to 4 showing a first embodiment of a control instrument for a printed wiring board according to the present invention, reference numeral 11 indicates a switch body. The switch body is formed at the upper portion thereof with flanges or jaws 12 which are engaged with the printed wiring board when the switch body is mounted on the board. An operating knob 13 is also provided on the upper portion of the switch body for operating a switching arrangement, not shown, disposed within the body.

The side surfaces of the body 11 which are not formed with the jaws (flanges) or jaws are formed with recesses or grooves 14 which longitudinally guide terminals, as hereinafter described. A plurality of terminals 15 made of a resilient material are also disposed on the bottom portion of the switch body with the terminals being folded upwardly along the side surfaces of the switch body and guided into the recesses 14. The leading end of each terminal 15 is folded to form a folded piece 15a. In the case where the terminal 15 is formed with the folded piece 15a, this folded piece 15a also has the function of the flange 12, and therefore can omit the jaw 12.

The printed wiring board 16 is formed with a through-hole 17 around which metal foils or printed leads to be joined to terminals are formed.

In use, the switch body 11 is inserted into the through-hole 17 of the printed wiring board 16 so as to be mounted on the printed wiring board and the folded terminals are resiliently engaged with the metal foils 18 of the printed wiring board. The folded pieces 15a of terminals 15 are completely fixed to the metal foils 18 by soldering.

Figure 5:
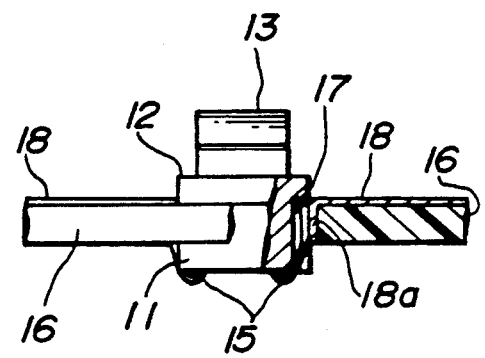
FIG. 5 is a cross-sectional side view showing a main portion of a second embodiment according to the present invention.

FIG. 5 is a partially cross-sectional view showing a second embodiment wherein the invention is applied to a switch.

Referring to FIG. 5, with the second embodiment, it has the same construction as that of the first embodiment except that no folded piece 15a is provided on the leading ends of the terminals and metal foils 18a which are extentions of the metal foil 18 are provided on the inner surfaces of the through-hole 17 formed in the printed wiring board in positions corresponding to the positions where the terminals 15 are disposed.

In case of the second embodiment, it has an advantage in that the terminals 15 are strongly, resiliently engaged with the metal foils 18a provided on the inner walls of the through-hole 17 of the printed wiring board. In this case, the terminals also may be soldered to the metal foils 18 or metal foils 18a of the printed wiring board.

Figure 6:
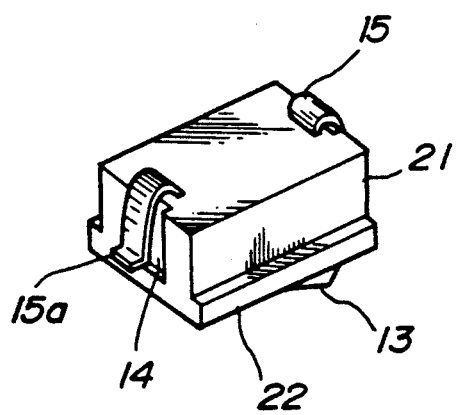
FIG. 6 is a perspective view showing a third embodiment according to the present invention.
Figure 7:
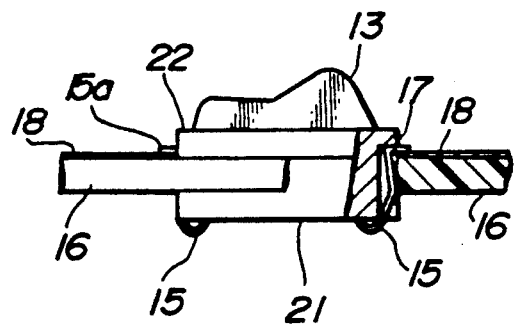
FIG. 7 is a partially cross-sectional view showing the third embodiment according to the present invention.

FIGS. 6 and 7 are, respectively, a perspective view and a partially cross-sectional front view showing a third embodiment where the invention is applied to a switch.

In FIGS. 6 and 7, the third embodiment according to the invention has the same construction as that of the first embodiment except for the direction in which the terminals are disposed and the direction in which flanges are formed. In other words, with the third embodiment, the terminals 15 are provided on the opposite sides of the switch body 21 perpendicular to the operating direction of the switch and the jaws 22 are formed on the opposite sides of the switch body in the same direction of that of operation of the switch. The functions of the terminals and the jaws in the third embodiment are similar to those of the first embodiment.

Figure 8:
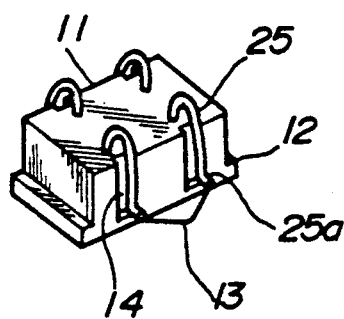
FIG. 8 is a perspective view showing a fourth embodiment according to the present invention.

FIG. 8 is a perspective view showing a fourth embodiment in which the invention is applied to a switch.

In FIG. 8, with the fourth embodiment, it has the same construction and functions as those of the first embodiment except that circular bars 25 with folded pieces 25a which are circular in cross section, are used as terminals.

Figure 9:
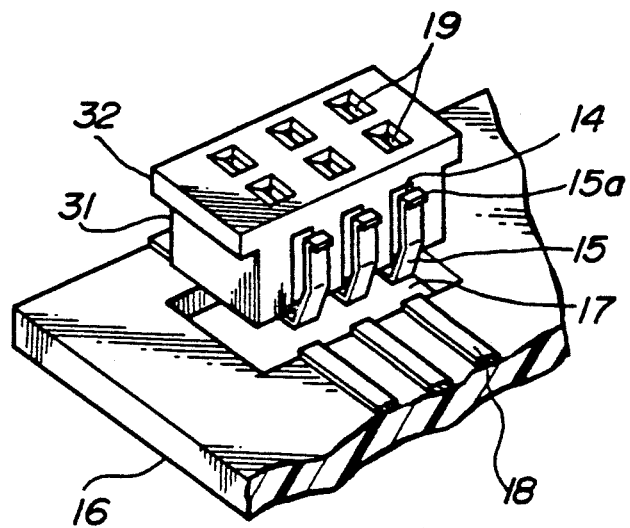
FIG. 9 is a perspective view showing a fifth embodiment according to the present invention.

FIG. 9 is a perspective view showing a fifth embodiment in which the invention is applied to a connector.

Referring to the FIG. 9, a plurality of terminals 15 are provided on a connector 31 at the lower portions thereof, with the terminals being folded upwardly and guided in recesses 14 which are formed on the sides of the connector. Each terminal 15 is provided at the leading end thereof with a folded piece 15a. The connector body is formed at the upper portion thereof with flanges or jaws 32 and provided at the upper surface thereof with holes 19 into which the male portions of another connector are to be inserted.

The connector 31 thus formed is inserted and mounted in the through-hole 17 of the printed wiring board 16 and each terminal 15 is joined to each metal foil of the printed wiring board in the same manner as described above. Each terminal 15 also may be soldered to each metal foil.

Althoguh it is preferred that, for each embodiment, the switch body is inserted into the through-hole from the pattern side of the printed wiring board on which the metal foils are formed, the invention also can be applied to the printed wiring board in which the pattern is formed on the reverse side.

Although the invention has been described with respect to the case where the switch or connector is used as an example of a control instrument, the invention can be equally applied to a display light or the like.

The invention, which has the above-mentioned construction and functions, has the following advantages or effects:

(1) The body can be readily fixed to the printed wiring board merely by inserting the body into the through-hole of the printed wiring board and the terminals can be connected to the circuit or metal foils of the printed wiring board without any special wiring operation.

(2) The body can be readily removed from the printed wiring board for the reason mentioned in item (1).

(3) Since the body is removable from the printed wiring board, it is not necessary to dispose any extra connectors on the printed wiring board.

(4) For the reason mentioned in item (3), in the case where the body is mounted on the printed wiring board, the height of projection from the printed wiring board is less than one half of the conventional arrangement.

(5) The terminals can be positively, electrically connected to the foils of the printed wiring board since the terminals are guided within the recesses or grooves to prevent deformation of the terminals, and to prevent offset of the terminals relative to the wiring position of the foils of the printed wiring board. Moreover, the recesses can make small a gap between the through-hole of the printed wiring board and the circumferential portion of the body.

(6) Since the through-hole of the printed wiring board can be formed in any position of the printed wiring board, the control instrument body can be mounted in any position of the printed wiring board to enhance utilization of the printed wiring board.

(7) Since the jaws are provided on the body at the sides thereof where the terminals are not provided, the jaws serves as a stopper when the body is inserted into the printed wiring board up to a predetermined or fixed position, and at the same time, in the case where the leading end or folded portion of the terminal and the pattern or metal foil of the printed wiring board are soldered together, the soldering operations can be readily made because of no jaw at that sides.

Figure 10:
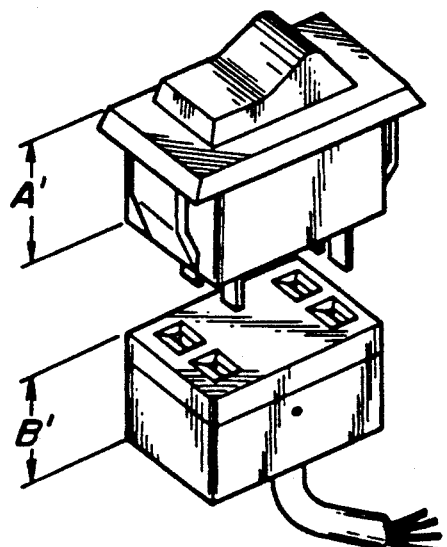
FIG. 10 represents a conventional device.

(8) The height of projection from the printed wiring board is A−B as shown in FIG. 1 according to the present, while it is A′+B′ as shown in FIG. 10 in case of a conventional device. Thus, due to the several times difference in height, the printed wiring board according to the present invention can be made more compact.

What I claim is:

1. An electrical apparatus comprising:
a body member having flanges which extend from opposing sides and adjacent a first end thereof;
a plurality of recesses formed on opposing lateral sides of said body member;
a plurality of resilient terminals provided at a second end surface of said body member and extending along said lateral sides in a one to one correspondence guided within said plurality of recesses;
a printed wiring board including a through-hole and a plurality of electrical conducting means formed on the surface of said printed wiring board and extending to an inner wall of said through-hole;

said body member being suspended by said flanges contacting the surface of said printed circuit board so that said body member is disposed within said through-hole, whereby distal ends of each of said plurality of resilient terminals resiliently engage only the electrical conducting means formed on the inner wall of said through-hole and terminate below the surface of said printed circuit board.

2. The electrical apparatus of claim 1, wherein each of said plurality of terminals are spring biased to provide a tight engagement of the body member within the through-hole of the printed wiring board.

3. The electrical apparatus of claim 1, wherein each of said plurality of resilient terminals are flat, narrow strip members and the electrical conducting means have a similar configuration, whereby the plurality of recesses guide the terminals into electrical connection with the electrical conducting means.

4. The electrical apparatus of claim 1, wherein each of said plurality of terminals have a round configuration.

5. The electrical apparatus of claim 1, wherein the body member is an electrical switch.

6. The electrical apparatus of claim 1, wherein the body member is an electrical receptacle.

7. The electrical apparatus of claim 1, wherein said plurality of recesses are on alternating sides of said body member with respect to said flanges.

* * * * *